(12) United States Patent
Inokuchi et al.

(10) Patent No.: US 8,466,049 B2
(45) Date of Patent: Jun. 18, 2013

(54) SEMICONDUCTOR DEVICE PRODUCING METHOD WITH SELECTIVE EPITAXIAL GROWTH

(75) Inventors: Yasuhiro Inokuchi, Toyama (JP); Atsushi Moriya, Toyama (JP); Katsuhiko Yamamoto, Himi (JP); Yoshiaki Hashiba, Takaoka (JP); Takashi Yokogawa, Toyama (JP)

(73) Assignee: Hitachi Kokusai Electric Inc., Tokyo ( * ) Notice: Subject to any disclaimer, the term of this patent is extended or adjusted under 35 U.S.C. 154(b) by 0 days.

(21) Appl. No.: 11/921,562

(22) PCT Filed: Jul. 25, 2006

(86) PCT No.: PCT/JP2006/314687
§ 371 (c)(1),
(2), (4) Date: Dec. 5, 2007

(87) PCT Pub. No.: WO2007/013464
PCT Pub. Date: Feb. 1, 2007

(65) Prior Publication Data
US 2009/0104740 A1 Apr. 23, 2009

(30) Foreign Application Priority Data
Jul. 29, 2005 (JP) ................................. 2005-221842

(51) Int. Cl.
*H01L 21/20* (2006.01)
(52) U.S. Cl.
USPC .................... 438/507; 438/481; 257/E21.461

(58) Field of Classification Search
USPC ................... 438/478, 481, 24, 300, 341, 507, 438/198; 257/E21.461
See application file for complete search history.

(56) References Cited

U.S. PATENT DOCUMENTS

| | | | | |
|---|---|---|---|---|
| 5,308,788 A | * | 5/1994 | Fitch et al. | 117/86 |
| 5,864,161 A | * | 1/1999 | Mitani et al. | 257/347 |
| 2002/0090818 A1 | * | 7/2002 | Thilderkvist et al. | 438/689 |
| 2003/0045075 A1 | * | 3/2003 | Joo et al. | 438/507 |
| 2004/0175959 A1 | * | 9/2004 | Tamura et al. | 438/778 |
| 2005/0066892 A1 | * | 3/2005 | Dip et al. | 118/715 |
| 2006/0115934 A1 | * | 6/2006 | Kim et al. | 438/149 |
| 2007/0042570 A1 | * | 2/2007 | Dip et al. | 438/478 |

FOREIGN PATENT DOCUMENTS

| | | |
|---|---|---|
| JP | 8-153688 A | 6/1996 |
| JP | 2003-86511 A | 3/2003 |
| JP | 2005-183514 A | 7/2005 |

* cited by examiner

*Primary Examiner* — Kimberly Rizkallah
*Assistant Examiner* — Duy T Nguyen
(74) *Attorney, Agent, or Firm* — Birch, Stewart, Kolasch & Birch, LLP

(57) ABSTRACT

Disclosed is a producing method of a semiconductor device, including: loading a silicon substrate into a processing chamber, the silicon substrate having a silicon nitride film or a silicon oxide film on at least a portion of a surface thereof and a silicon surface being exposed from the surface; and alternately repeating a first introducing at least a silane-compound gas into the processing chamber and a second introducing at least etching gas a plurality of times to selectively grow an epitaxial film on the silicon surface, wherein the alternate repeating is started with the second introducing prior to the first introducing.

11 Claims, 4 Drawing Sheets

US 8,466,049 B2

SEMICONDUCTOR DEVICE PRODUCING METHOD WITH SELECTIVE EPITAXIAL GROWTH

BACKGROUND OF THE INVENTION

1. Field of the Invention

The present invention relates to a semiconductor device producing method, and more particularly, to a semiconductor device producing method for causing a selective silicon epitaxial growth, for example, on a source/drain of an MOSFET (Metal-Oxide-Semiconductor Field Effect Transistor).

2. Description of the Related Art

As integration degree and performance of MOSFETs are enhanced, it is required to both enhance characteristics of a semiconductor device and realize a finely-structured semiconductor device. To achieve both of them, it is required to reduce a contact resistance and so forth to solve a problem of the source/drain of the MOSFET. As one method for solving these problems, there is a method for selectively growing a silicon epitaxial film on the source/drain (see Japanese Patent Application Publication Laid-open No. 2005-183514) for example).

However, a silicon film is also grown on an insulating film such as a silicon nitride film, and there is a problem that a phenomenon of a selective growth failure occurs and process control is difficult.

SUMMARY OF THE INVENTION

It is, therefore, a main object of the present invention to provide a semiconductor device producing method capable of enhancing selectivity in selective growth process to enlarge a process margin, producing a selective growth film of high quality, and improving yields.

According to one aspect of the present invention, there is provided a producing method of a semiconductor device, comprising:

loading a silicon substrate into a processing chamber, the silicon substrate having a silicon nitride film or a silicon oxide film on at least a portion of a surface thereof and a silicon surface being exposed from the surface; and alternately repeating a first introducing at least a silane-compound gas into the processing chamber and a second introducing at least etching gas a plurality of times to selectively grow an epitaxial film on the silicon surface, wherein the alternate repeating is started with the second introducing prior to the first introducing.

DESCRIPTION OF THE PREFERRED EMBODIMENTS

A preferred embodiment of the present invention provides a producing method of a semiconductor device, comprising:

loading a silicon substrate into a processing chamber, the silicon substrate having a silicon nitride film or a silicon oxide film on at least a portion of a surface thereof and a silicon surface being exposed from the surface; and alternately repeating a first introducing at least a silane-compound gas into the processing chamber and a second introducing at least etching gas a plurality of times to selectively grow an epitaxial film on the silicon surface, wherein the alternate repeating is started with the second introducing prior to the first introducing.

Preferably, the silane-compound gas is a monosilane gas or a disilane gas.

Preferably, the etching gas is a chlorine gas, a fluorine gas or a hydrogen chloride gas.

Preferably, the repeating further includes an introducing a hydrogen gas after each of the first introducing and the second introducing has been executed, wherein a chlorine atom or a fluorine atom adhered to the silicon surface is removed in the introducing the hydrogen gas.

Preferably, when the chlorine gas, the fluorine gas or the hydrogen chloride gas is introduced, a hydrogen gas is introduced simultaneously.

Preferably, when the first introducing and the second introducing are alternately repeated a plurality of times, and the plurality of times of the second introducings are respectively executed under the same condition.

Preferably, when the first introducing and the second introducing are alternately repeated a plurality of times, introducing time of the etching gas introduced in an initial second introducing out of the plurality of times of the second introducings is longer than introducing time of the etching gas introduced in subsequent second introducings.

Preferably, when the first introducing and the second introducing are alternately repeated a plurality of times, a flow rate of the etching gas introduced in an initial second introducing out of the plurality of times of the second introducings is greater than a flow rate of the etching gas introduced in subsequent second introducings.

A preferred embodiment of the present invention will be explained in detail with reference to the drawings.

Figure 1:
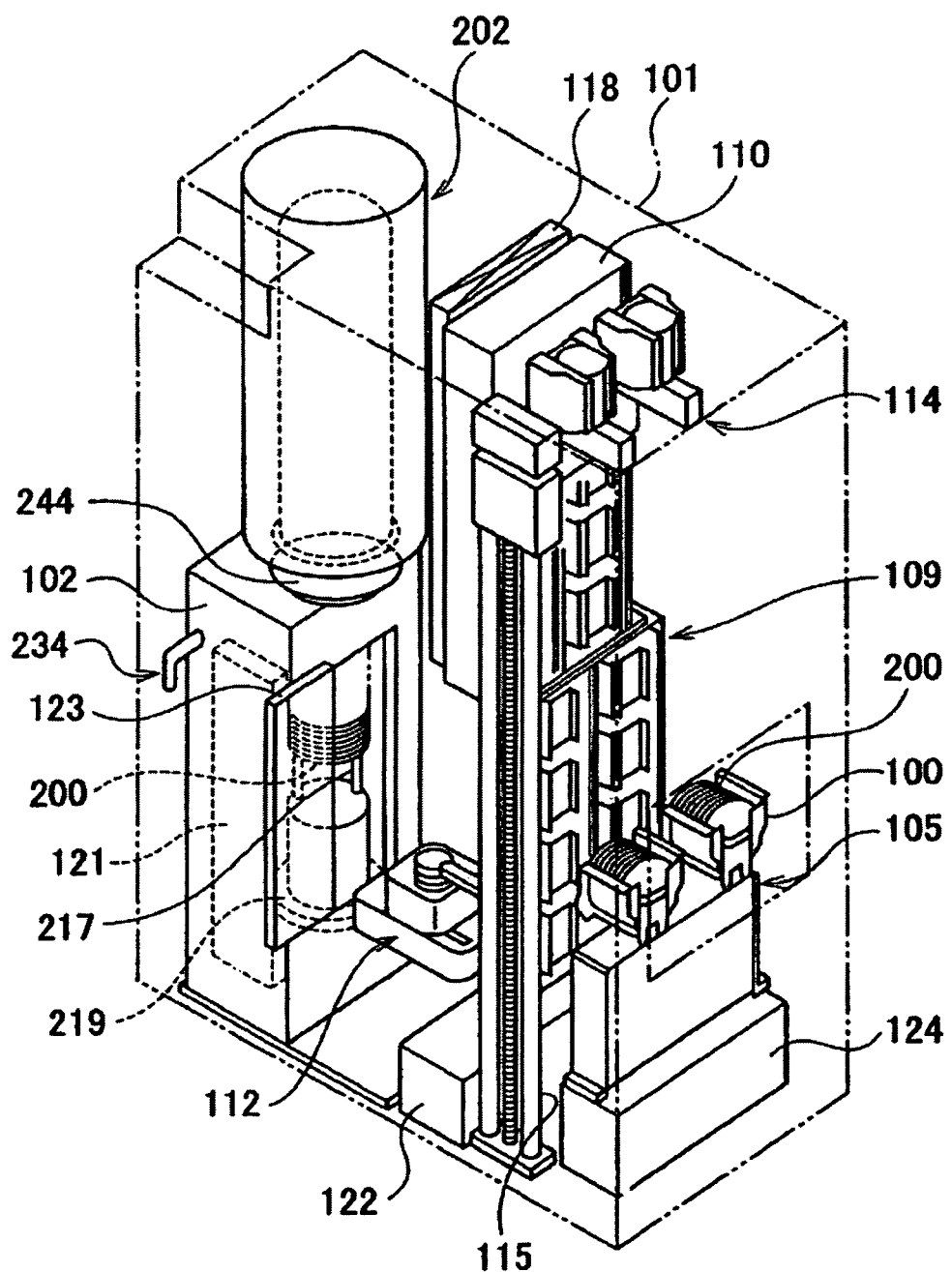
FIG. 1 is a schematic perspective view for explaining a low pressure CVD apparatus according to a preferred embodiment of the present invention.
Figure 2:
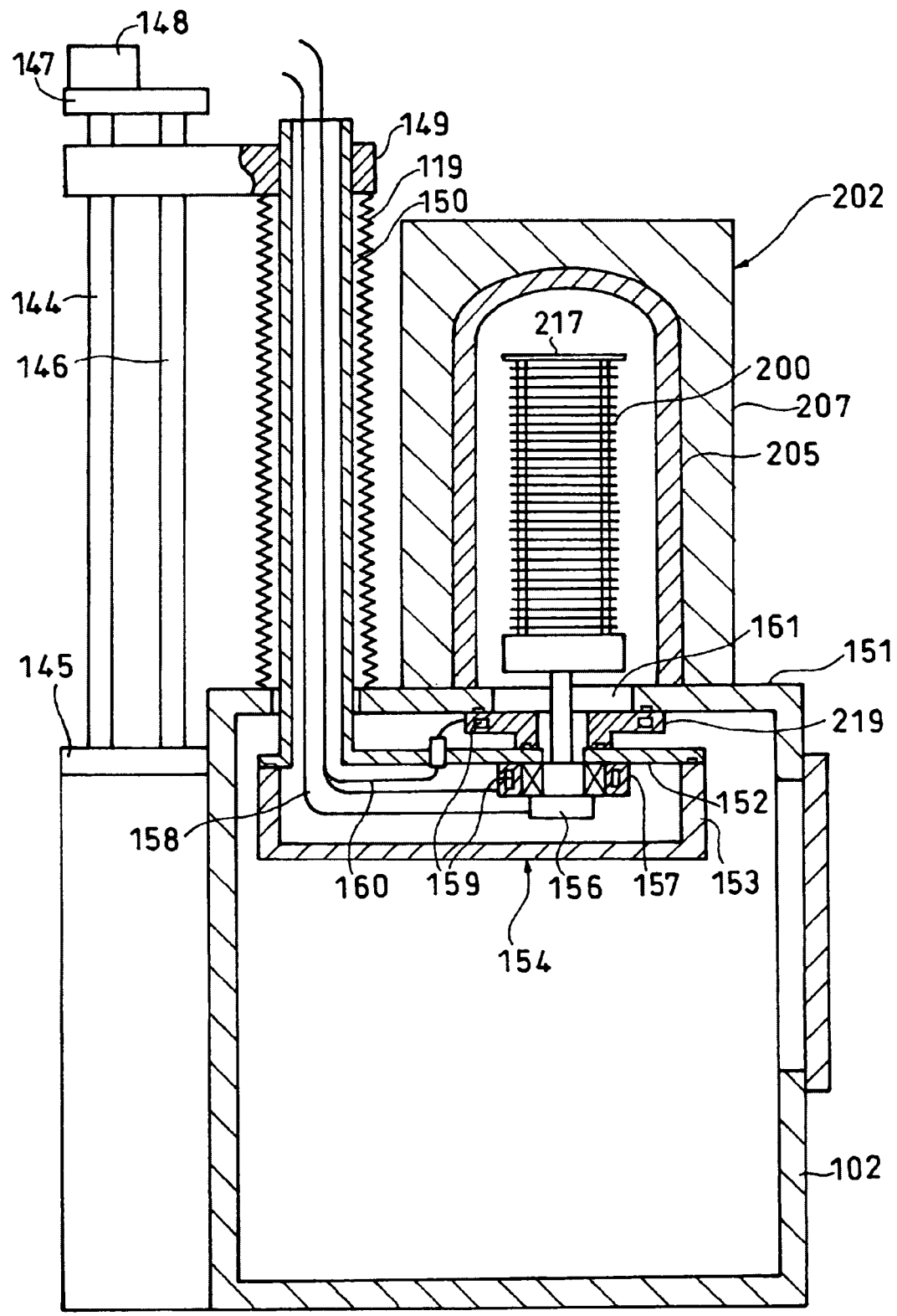
FIG. 2 is a schematic vertical sectional view for explaining the low pressure CVD apparatus according to the preferred embodiment of the present invention.
Figure 3:
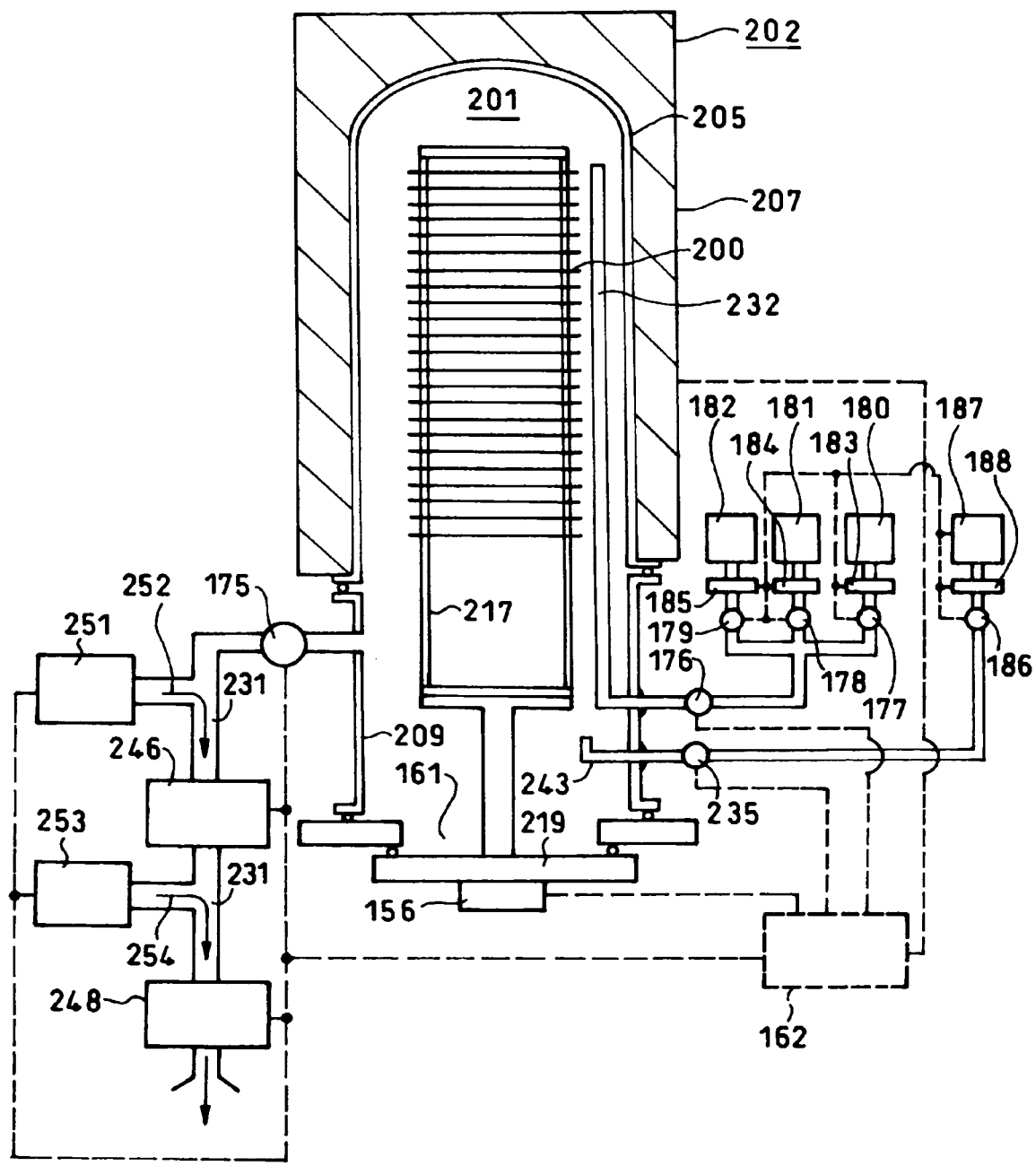
FIG. 3 is a schematic vertical sectional view for explaining a processing furnace of the low pressure CVD apparatus according to the preferred embodiment of the present invention.

FIG. 1 is a schematic perspective view for explaining a low pressure CVD apparatus according to a preferred embodiment of the present invention. FIG. 2 is a schematic vertical sectional view for explaining the low pressure CVD apparatus according to the preferred embodiment of the present invention. FIG. 3 is a schematic vertical sectional view for explaining a processing furnace of the low pressure CVD apparatus according to the preferred embodiment of the present invention.

As shown in FIG. 1, a cassette stage 105 as a holder delivery member for giving and receiving a cassette 100 as a substrate accommodation container to and from an external transfer device (not shown) is provided in the casing 101 on the front surface side. A cassette elevator 115 as elevator means is provided behind the cassette stage 105. A cassette moving machine 114 as transfer means is mounted on the cassette elevator 115. Cassette shelves 109 as mounting means of the cassettes 100 are provided behind the cassette elevator 115. The cassette shelves 109 are provided on a slide stage 122 such that they can laterally move. Buffer cassette shelves 110 as mounting means of the cassettes 100 are provided above the cassette shelves. A clean unit 118 is provided behind the buffer cassette shelves 110 so that clean air flows through inside the casing 101.

A processing furnace 202 is provided above a rear portion of the casing 101. A processing chamber 201 for subjecting wafers 200 to predetermined processing is formed in the processing furnace 202. A load lock chamber 102 as a hermetic chamber is connected to a lower side of the processing furnace 202 through a gate valve 244 as a partition valve. A load lock door 123 as partition means is provided at a front face of the load lock chamber 102 at a location opposed to the cassette shelves 109. A boat elevator 121 as elevator means is provided in the load lock chamber 102. A boat 217 as substrate holding means holds wafers 200 as substrates in a horizontal attitude in multi-layers. The boat elevator 121 vertically moves the boat 217 between the processing chamber 201 and the load lock chamber 102. A seal cap 219 as a lid is mounted on the boat elevator 121 to support the boat 217 vertically. A loading elevator as elevator means (not shown) is provided between the load lock chamber 102 and the cassette shelves 109, and a wafer transfer device 112 as transfer means is mounted on the loading elevator.

The transfer operation of the cassette moving machine 114 and the like is controlled by transfer control means 124.

Next, a structure around a processing furnace of the low pressure CVD apparatus which is a substrate processing apparatus of the embodiment will be explained with reference to FIG. 2.

A lower substrate 145 is provided on an outer surface of the load lock chamber 102 as a hermetic chamber, an upper substrate 147 is provided on an upper end of a guide shaft 146 which stands on the lower substrate 145, and a ball screw 144 is rotatably provided between the lower substrate 145 and the upper substrate 147. The ball screw 144 is rotated by an elevator motor 148 provided on the upper substrate 147. An elevating stage 149 is fitted to the guide shaft 146 such that the elevating stage 149 can vertically move, and the elevating stage 149 is threadably engaged with the ball screw 144.

A hollow elevator shaft 150 is vertically provided to the elevating stage 149, and a support portion of the elevating stage 149 and the elevator shaft 150 is of a hermetic structure. The elevator shaft 150 loosely penetrate a top board 151 of the load lock chamber 102, and reaches near a bottom face of the load lock chamber 102. A penetrating portion of the top board 151 has an enough margin so that the penetrating portion does not come into contact with the vertical motion of the elevator shaft 150. An elastic wall (e.g., bellows 119) covering a projecting portion of the elevator shaft 150 is hermetically provided between the load lock chamber 102 and the elevating stage 149. The bellows 119 have sufficient expansion amount corresponding to the a vertically moving amount of the elevating stage 149, and an inner diameter of the bellows 119 is sufficiently greater than an outer shape of the elevator shaft 150 so that the elevator shaft 150 does not come into contact with the bellows 119 when the bellows 119 expands and contracts.

An elevating board 152 is horizontally fixed to a lower end of the elevator shaft 150. A driving portion cover 153 is mounted on a lower surface of the elevating board 152, and a driving portion accommodating case 154 is constituted. A jointed portion of the elevating board 152 and the driving portion cover 153 is hermetically closed by a seal member such as an O-ring. Hence, an interior of the driving portion accommodating case 154 is isolated from an atmosphere in the load lock chamber 102.

A rotation mechanism 156 for the boat 217 is provided on a lower surface of the elevating board 152, and a periphery of the rotation mechanism 156 is cooled by cooling means 157.

A power supply cable 158, which is guided from an upper end of the elevator shaft 150 to the rotation mechanism 156 through a hollow portion of the elevator shaft 150, is connected to the rotation mechanism 156. A cooling water passage 159 is formed in the cooling means 157 and the seal cap 219. A cooling water pipe 160 for supplying cooling water is connected to the cooling water passage 159, and the cooling water pipe 160 passes through the hollow portion of the elevator shaft 150 from the upper end of the elevator shaft 150.

The seal cap 219 is hermetically provided on the upper surface of the elevating board 152. The elevator motor 148 is driven and the ball screw 144 is rotated so that the driving portion accommodating case 154 is moved upward through the elevating stage 149 and the elevator shaft 150.

The seal cap 219 closes a furnace opening 161 which is an opening of the processing furnace 202 near the top dead center of the elevating stage 149 to establish a state where wafers can be processed. If the processing of wafers is completed, the elevator motor 148 is driven, and the boat 217 is lowered so that the wafers can be unloaded outside.

Next, details of the processing furnace of the low pressure CVD apparatus which is the substrate processing apparatus of the embodiment will be explained with reference to FIG. 3.

As shown in FIG. 3, the processing furnace 202 includes a reaction tube comprising an outer tube 205, a gas exhausting pipe 231, a gas supply pipe 232, a gas supply pipe 234, a manifold 209, the seal cap 219 which covers a lower end (furnace opening 161) of the manifold 209 to hermetically closes the processing chamber 201, the boat 217 as a wafer placing body on which the wafers 200 are to be placed in multi-layers in the vertical direction and which is provided on the seal cap 219, the rotation mechanism 156 for rotating the boat 217, a heater 207 having a heater wire and a thermal insulation member (not shown) for heating the wafers 200, and the like.

The outer tube 205, the manifold 209, the seal cap 219 and the like constitute the processing chamber 201.

In the structure of this processing furnace 202, processing gas is supplied from a first gas supply source 180, a second gas supply source 181 and a third gas supply source 182, a flow rate thereof is controlled by an MFC (mass flow controller) 183, an MFC 184 and an MFC 185, respectively, as gas flow rate control means and then, the gas is introduced from an upper portion of the processing chamber 201 by the one gas supply pipe 232 through valves 177, 178 and 179. The gas supply pipe 232 is provided penetrating the manifold 209 and extending in the outer tube 205 to an upper portion of the processing chamber 201. The gas supply pipe 232 is provided with a valve 176.

A cleaning gas supply pipe 243 is provided also penetrating the manifold 209. Cleaning gas is supplied from a fourth gas supply source 187, a flow rate thereof is controlled by an MFC 188 as gas flow rate control means and then, the gas is introduced into the processing chamber 201 by the cleaning gas supply pipe 243 through valves 186 and 235.

A gas exhausting pipe 231 is provided in communication with the manifold 209. The gas exhausting pipe 231 is provided with an exhaust valve 175, a vacuum pump 246 as an exhaust system and a harm-removing device 248, in this order toward downstream of the gas exhausting pipe 231. An atmosphere in the processing chamber 201 is exhausted from the processing chamber 201 by the vacuum pump 246 connected to the gas exhausting pipe 231.

An inert gas supply system 251 is provided in communication with the gas exhausting pipe 231 between the exhaust valve 175 and the vacuum pump 246. Inert gas 252 heated by the inert gas supply system 251 is supplied to the gas exhausting pipe 231 between the exhaust valve 175 and the vacuum pump 246. An inert gas supply system 253 is provided in communication with the gas exhausting pipe 231 between the vacuum pump 246 and the harm-removing device. Inert gas 254 heated by the inert gas supply system 253 is supplied to the gas exhausting pipe 231 between the vacuum pump 246 and the harm-removing device.

The heater 207, the rotation mechanism 156, the MFCs 183, 184, 185 and 187, the valves 175, 176, 177, 178, 179, 235 and 263, the elevator motor 148, the load lock door 123, the gate valve 244, the vacuum pump 246, the harm-removing device 248, the inert gas supply systems 251 and 253, and the like are controlled by a control device 162. The control device 162 controls the vertical motion of the boat 217 on which the wafers 200 are placed between the processing chamber 201 and the load lock chamber 102, opening and closing motion of the gate valve 244 and the load lock door 123, the temperature in the processing furnace 202, supply of processing gas and the cleaning gas into the processing chamber 201, exhausting operation of gas from the processing chamber 201, supply of a nitrogen gas as inert gas into the load lock chamber 102, exhausting operation of gas from the load lock chamber 102, supply and stop of cooling water to the cooling water passage 159, supply of heated inert gas 252 and 254 to the gas exhausting pipe 231, the temperature of the inert gas, and the like.

Next, as one example of processing of a semiconductor wafer 200 in the low pressure CVD apparatus which is the substrate processing apparatus of the embodiment, a case in which an epitaxial Si film is selectively formed on a silicon exposed face of the semiconductor silicon wafer using a monosilane gas, a chlorine gas and a hydrogen gas will be explained.

The cassette 100 transferred from an external transfer device (not shown) is placed on the cassette stage 105, the attitude of the cassette 100 is converted 90° on the cassette stage 105, and the cassette 100 is transferred to the cassette shelves 109 or the buffer cassette shelves 110 in cooperation with vertical motion and lateral motion of the cassette elevator 115 and forward and backward motion of the cassette moving machine 114.

The wafers 200 are transferred onto the boat 217 from the cassette shelves 109 by the wafer transfer device 112. As preparation for placing the wafers 200 on the boat 217, the boat 217 is lowered by the boat elevator 121, the processing chamber 201 is closed by the gate valve 244, and purge gas (a nitrogen gas) is introduced into the load lock chamber 102 from a purge nozzle 234. After pressure in the load lock chamber 102 is returned to the atmospheric pressure, the load lock door 123 is opened.

A horizontal slide mechanism 122 horizontally moves the cassette shelves 109 and positions the cassette 100 to be placed such that the cassette 100 is opposed to the wafer transfer device 112. The wafer transfer device 112 moves the wafers 200 to the boat 217 from the cassette 100 in cooperation with vertical motion and rotation motion of the wafer transfer device 112. The wafers 200 are transferred with respect to some cassettes 100. After a predetermined number of wafers have been moved to the boat 217, the load lock door 123 is closed, and the load lock chamber 102 is evacuated through an exhaust pipe.

After the evacuation, a nitrogen gas is introduced by the gas purge nozzle 234, and if pressure in the load lock chamber 102 is returned to the atmospheric pressure with the nitrogen gas, the gate valve 244 is opened, the elevator motor 148 is driven, the boat 217 is inserted into the processing chamber 201 by the boat elevator 121, the processing chamber 201 is closed by closing the furnace opening 161, which is an opening of the processing furnace 202, by the seal cap 219. When the boat 217 is inserted into the processing chamber 201, the temperature in the processing chamber 201 is maintained at 200° C. The pressure in the load lock chamber 102 is maintained substantially at the atmospheric pressure with the nitrogen gas until the boat 217 is lowered to the load lock chamber 102 after processing the wafers 200.

Next, the exhaust valve 175 is opened to exhaust the atmosphere from the processing chamber 201, and the pressure in the processing chamber 201 is reduced to about 0.1 Pa. Then, the heater 207 is controlled by the control device 162, the temperature in the processing chamber 201 and thus, the temperature of the wafers 200 is maintained at 750° C. Then, the rotation mechanism 156 is driven to rotate the boat 217 at a predetermined number of rotations.

A monosilane gas, a chlorine gas (or a hydrogen chloride gas) and a hydrogen gas are charged into the first gas supply source 180, the second gas supply source 181 and the third gas supply source 182, respectively, as processing gas, and the flow rates thereof are controlled by the MFCs 183, 184 and 185, respectively. The valves 177, 178 and 179 which open and close the gas supply pipe are opened, the valve 176 is opened, the processing gas is supplied to the processing chamber 201 through the gas supply pipe 232 by a later-described method, while the gas is exhausted from the processing chamber 201 through the gas exhausting pipe 231, and thereby the pressure in the processing chamber 201 is maintained at 100 Pa, and an epitaxial Si film is formed on the silicon exposed face of the wafer 200 by the low pressure CVD method. At that time, $N_2$ gas which is the inert gas 252 heated to 100 to 200° C. is supplied from the inert gas supply system 251 to the gas exhausting pipe 231 between the exhaust valve 175 and the vacuum pump 246, and $N_2$ gas which is the inert gas 254 heated to 100 to 200° C. is supplied from the inert gas supply system 253 to the gas exhausting pipe 231 between the vacuum pump 246 and the harm-removing device.

After the wafers 200 are subjected to a predetermined film forming processing in the processing chamber 201, gas in the processing chamber 201 is replaced by a nitrogen gas as purge gas. That is, after the film forming processing, (1) pressure in the processing chamber 201 is reduced to about 0.1 Pa through the gas exhausting pipe 231 and then, the nitrogen gas ($N_2$) is flowed from the gas supply source (not shown) through the gas supply pipe 232 until the pressure in the processing chamber 201 becomes about 30 Pa to purge the processing chamber 201 and then, (2) the supply of the nitrogen gas is stopped, the pressure in the processing chamber 201 is again reduced to about 0.1 Pa through the gas exhausting pipe 231 and then, a nitrogen gas is flowed through the gas supply pipe 232 until the pressure in the processing chamber 201 becomes about 30 Pa to purge the processing chamber 201. The operations (1) and (2) are repeated four times with purging for three minutes and pressure reduction for three minutes. Then, a nitrogen gas is introduced into the processing chamber 201 through the gas supply pipe 232, and the pressure in the processing chamber 201 is returned to about atmospheric pressure using the nitrogen gas. The pressure in the load lock chamber 102 is maintained substantially at the atmospheric pressure with the nitrogen gas.

In this state, if the elevator motor 148 is driven, the boat 217 on which the wafers 200 are placed is lowered from the processing chamber 201 into the load lock chamber 102 by the boat elevator 121, and the gate valve 244 is closed.

Then, the load lock chamber 102 is evacuated to 10 Torr or less through the exhaust pipe, and a nitrogen gas is introduced into the processing chamber 201 from the purge nozzle 234, and the pressure in the load lock chamber 102 is returned to the atmospheric pressure using nitrogen gas.

Then, the load lock door 123 is opened, the processed wafers 200 are moved to the cassette stage 105 from the boat 217 through the cassette shelves 109 in reverse procedure to the above-described operation, and the wafers 200 are transferred by the external transfer device (not shown).

Whenever the epitaxial Si film is formed predetermined times as described above, the boat 217 is inserted into the processing chamber 201 by the boat elevator 121 in a state where no wafer 200 is placed on the boat 217, and the processing chamber 201 is closed by closing the furnace opening 161 which is the opening of the processing furnace 202 by the seal cap 219.

Next, the exhaust valve 175 is opened, an atmosphere in the processing chamber 201 is exhausted, and the pressure in the processing chamber 201 is reduced. The control device 162 controls the heater 207, and maintains the temperature in the processing chamber 201 at 400° C. Then, the rotation mechanism 156 is driven to rotate the boat 217 at a predetermined number of rotations.

$ClF_3$ as cleaning gas is charged into the fourth gas supply source 187, and its flow rate is controlled by the MFC 188. The valve 186 is opened, the valve 235 is opened, $ClF_3$ as the cleaning gas is supplied to the processing chamber 201 through the gas supply pipe 243, while the gas is exhausted through the gas exhausting pipe 231, and thereby the cleaning operation is carried out under the condition that the pressure in the processing chamber 201 is maintained at a predetermined pressure.

At that time, $N_2$ gas which is the inert gas 252 heated to 50 to 150° C. is supplied to the gas exhausting pipe 231 between the exhaust valve 175 and the vacuum pump 246 from the inert gas supply system 251, and $N_2$ gas which is the inert gas 254 heated to 50 to 150° C. is supplied to the gas exhausting pipe 231 between the vacuum pump 246 and the harm-removing device from the inert gas supply system 253.

Here, the selective growth of the silicon epitaxial film on the wafer 200 is carried out in the following manner.

That is, a silicon substrate is loaded into the processing chamber 201, the silicon substrate having a silicon nitride film or a silicon oxide film on at least a portion of a surface thereof and a silicon surface thereof being exposed. Then a first step of introducing at least one of a silane-compound gas or a germane-compound gas, or a hydrogen gas if necessary into the processing chamber 201, and a second step of introducing a chlorine gas, a fluorine gas or a hydrogen chloride gas, or a hydrogen gas if necessary, are repeated in this order a plurality of times to selectively grow an epitaxial film on the silicon surface. At that time, before repeating the first step and the second step in this order the plurality of times, the second step is first carried out to enhance the selectivity.

The first step is a film growth step. The second step is an etching step of removing a silicon nucleus or a silicon film which grows on an insulating film such as a silicon nitride film.

On the insulating film such as the silicon nitride film, the start of growth of the silicon film delays as compared with the start of growth on the silicon film, this growth delay time is called incubation time, and the film growth time in the first step is set such that it does not exceed the incubation time.

After the second step, chlorine or a fluorine atom adheres on the substrate surface and this inhibits growth of the film, and the film growing amount is reduced on both the insulating film and the silicon film. Therefore, the film growing time in the first step when the first step and the second step are repeated in this order the plurality of times to carry out the selective growth is set under the assumption that chlorine or a fluorine atom adheres.

Before a series of selective epitaxial growth is carried out, pre-processing of the substrate is carried out to clean the silicon surface. At that time, since chlorine or a fluorine atom which becomes a factor for inhibiting the growth of the film does not exist, the film growing amounts on the insulating film and on the silicon film are greater than the film growing amount by repetition of the first step and the second step.

For these reasons, if the first step and the second step are repeated the plurality of times from the first step after the pre-processing of the substrate, a film grows on the insulating film at an initial first step, there is a problem that the selective growth failure occurs, and it is difficult to control the process.

Hence, in this embodiment, before the first step and the second step are repeated the plurality of times, the second step is first carried out to establish a state where chlorine or a fluorine atom adheres to the substrate surface, and the selectivity is enhanced.

In this embodiment, after the second step, chlorine or a fluorine atom adheres to the substrate surface and this inhibits the growth of a film. Therefore, in order to reduce the atoms, it is preferable that a hydrogen gas is introduced to purge. However, it is difficult to remove the atoms completely, and the film growing amount is reduced on both the insulating film and the silicon film. Therefore, when a hydrogen gas is introduced to purge after the second step, the second step is first carried out and then, the first step and the second step are repeated in this order the plurality of times to carry out the selective epitaxial growth of silicon.

It is preferable that a hydrogen gas is introduced to purge also after the first step.

It is preferable that etching gas is supplied in the second steps under the same conditions including the initial second step. This is because that when a chlorine gas is used as the etching gas, if the amount of Cl terminal is small, the selective growth failure is prone to occur, and if the amount of Cl terminal is high, the growing speed is reduced and this is not preferable.

As the condition of the etching gas supply step in the initial second step, the following i) or ii) may be employed:

i) In the initial second step, the etching gas is supplied for longer than etching gas supply time in the second and each subsequent second step. This is because that in the first growing step by a first step after excessive etching gas flows, the growing on the Si surface delays, but the selective growth failure does not occur, and ii) A flow rate of the etching gas supply in the initial second step is greater than a flow rate of the etching gas supply in the second and each subsequent second step, and the etching gas supply time of the initial second step is the same as that of the second and each subsequent second step.

Figure 4:
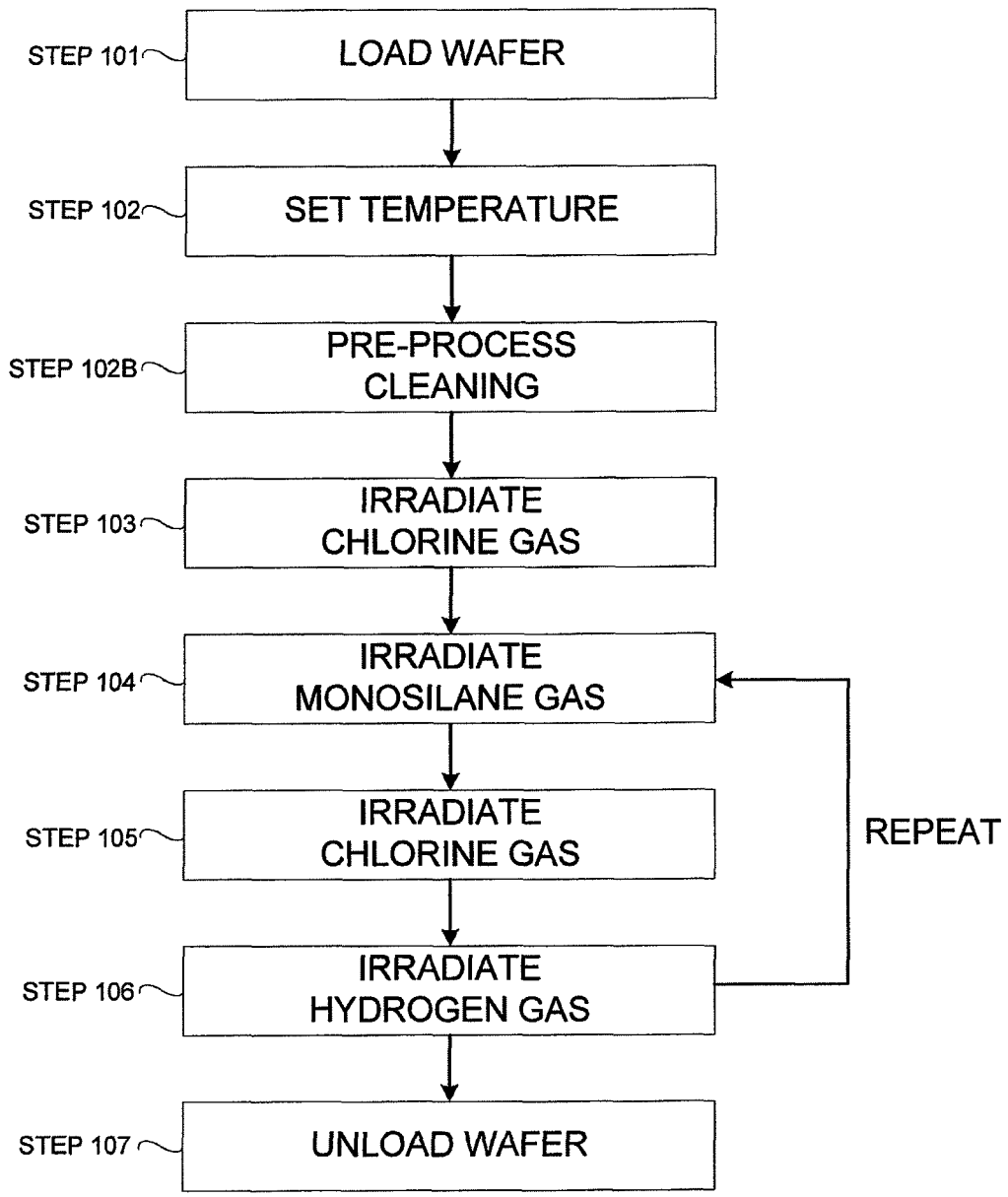
FIG. 4 is a diagram for explaining an example of a process sequence according to the preferred embodiment of the present invention.

An example of process sequence in this embodiment is shown in FIG. 4.

First, wafers 200 are loaded into the processing chamber 201 (step 101).

Next, the temperature is set such that the temperature of the wafers 200 becomes a predetermined temperature (step 102).

Next, a chlorine gas is introduced into the processing chamber 201 in the second step (step 103).

Next, a monosilane gas is introduced into the processing chamber 201 in the first step (step 104).

Next, a chlorine gas is introduced into the processing chamber 201 in the second step (step 105).

Next, a hydrogen gas is introduced into the processing chamber 201 (step 106).

Then, the steps 104 to 106 are repeated predetermined times to carry out the selective growth of silicon.

When the selective growth is completed, the wafers 200 are unloaded from the processing chamber 201 (step 107).

In this embodiment, after the pre-processing of a substrate and before the first step and the second step are repeated, the etching processing (step 103) is carried out in the second step. With this, selective growth failure does not occur in the initial first step (step 104), and a process margin is enlarged.

After the etching processing in the second step (step 103) and before the initial first step is carried out (step 104), the purging may be carried out using a hydrogen gas.

After the growing processing in the first step (step 104) and before the second step (step 105) is carried out, the purging processing may be carried out using a hydrogen gas.

Preferable growing conditions in the embodiment are as follows:

In step 102, the growing temperature is set to 500 to 700° C.

In the irradiation of a monosilane gas in step 104, a flow rate of $SiH_4$ is in a range of 1 to 1000 sccm (preferably 1 to 300 sccm), a flow rate of $H_2$ is in a range of 500 to 10000 sccm, pressure is in a range of 1 to 1000 Pa, and time is in a range of 30 to 180 sec.

In the irradiation of a chlorine gas in step 105, a flow rate of $Cl_2$ is in a range of 1 to 1000 sccm (preferably 1 to 500 sccm), a flow rate of $H_2$ is in a range of 500 to 10000 sccm, pressure is in a range of 1 to 1000 Pa, and time is in a range of 30 to 180 sec.

In the irradiation of a hydrogen gas in step 106, a flow rate of $H_2$ is in a range of 10 to 50000 sccm (preferably 500 to 10000 sccm), time is in a range of 60 to 300 sec, and pressure is in a range of 1 to 1000 Pa. In the purging step (evacuation is also carried out), $N_2$ may be used instead of $H_2$, but since $H_2$ is used as a base in steps 104 and 105, it is more preferable to use $H_2$.

The chlorine gas irradiation in step 105 is carried out under the same condition as that in step 105, or is carried out under the condition that a flow rate of $Cl_2$ is in a range of 1 to 1000 sccm and irradiation time is in a range of 30 to 600 sec. If cleaning of an interface is taken into account, longer time such as 300 sec is preferable.

The entire disclosures of Japanese Patent Application No. 2005-221842 filed on Jul. 29, 2005 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, according to the preferred embodiment of the present invention, it is possible to enhance the selectivity in selective growth process to enlarge a process margin, produce a selective growth film of high quality, and improve yields.

As a result, the present invention can suitably be utilized for a producing method of a semiconductor device.

The invention claimed is:

1. A producing method of a semiconductor device, comprising:
    loading a silicon substrate into a processing chamber, the silicon substrate having a silicon nitride film or a silicon oxide film on at least a portion of a surface thereof and a silicon surface being exposed from the surface;
    pre-processing the substrate by introducing a cleaning gas into the chamber to clean the substrate surface;
    a first step of introducing at least an etching gas into the processing chamber after loading the silicon substrate to establish a state where a chlorine or a fluorine atom, which is a factor to inhibit growth of an epitaxial film, adheres to both a surface of the silicon nitride film or the silicon oxide film and the silicon surface;
    a second step of introducing at least a silane-compound gas into the processing chamber after the first step;
    a third step of introducing at least the etching gas into the processing chamber after the second step; and
    repeating the second step and the third step a plurality of times to selectively grow an epitaxial film on the silicon surface.

2. The producing method of the semiconductor device according to claim 1, wherein the silane-compound gas is a monosilane gas or a disilane gas.

3. The producing method of the semiconductor device according to claim 1, wherein the etching gas is a chlorine gas, a fluorine gas or a hydrogen chloride gas.

4. The producing method of the semiconductor device according to claim 1, wherein the repeating further includes:
    introducing a hydrogen gas after each of the second step and the third step has been executed, wherein the chlorine atom or the fluorine atom adhered to the silicon surface is removed in the introducing the hydrogen gas.

5. The producing method of the semiconductor device according to claim 3, wherein when the chlorine gas, the fluorine gas or the hydrogen chloride gas is introduced, a hydrogen gas is introduced simultaneously.

6. The producing method of the semiconductor device according to claim 1, wherein
    the second step and the third step are alternately repeated a plurality of times, and
    the plurality of times of performing the third step are respectively executed under the same condition.

7. The producing method of the semiconductor device according to claim 1, wherein when the second step and the third step are alternately repeated a plurality of times, introducing time of the etching gas introduced in the first step is longer than introducing time of the etching gas introduced in subsequent third steps.

8. The producing method of the semiconductor device according to claim 1, wherein when the second step and the third step are alternately repeated a plurality of times, a flow rate of the etching gas introduced in the first step is greater than a flow rate of the etching gas introduced in subsequent third steps.

9. The producing method of the semiconductor device according to claim 1, wherein the repeating includes:
    introducing hydrogen gas after the second step but before the third step to purge the processing chamber; and
    introducing hydrogen gas after the third step into the processing chamber to remove the chlorine atom or the fluorine atom adhered to the silicon surface.

10. The producing method of the semiconductor device according to claim 1, wherein the second step has a duration that does not exceed an incubation time of silicon film on the silicon nitride or silicon oxide film applied on the portion of the silicon substrate.

11. The producing method of the semiconductor device according to claim 1, further comprising:
    controlling the temperature in the processing chamber such that the temperature of the silicon substrate is within the range of 500° C. to 700° C.

* * * * *